(12) United States Patent
Reinhardt

(10) Patent No.: US 8,907,741 B2
(45) Date of Patent: Dec. 9, 2014

(54) ACOUSTIC WAVE POWER DEVICE

(71) Applicant: Commissariat a l'Energie Atomique et aux Energies Alternatives, Paris (FR)

(72) Inventor: Alexandre Reinhardt, Saint Martin d'Heres (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 253 days.

(21) Appl. No.: 13/661,865

(22) Filed: Oct. 26, 2012

(65) Prior Publication Data

US 2013/0106531 A1    May 2, 2013

(30) Foreign Application Priority Data

Oct. 28, 2011  (FR) ..................... 11 59816

(51) Int. Cl.
  *H03H 9/74* (2006.01)
  *H03H 9/76* (2006.01)
(52) U.S. Cl.
  CPC .. *H03H 9/74* (2013.01); *H03H 9/76* (2013.01)
  USPC ............................. 333/133; 333/193; 333/195
(58) Field of Classification Search
  CPC ............. H03H 9/70; H03H 9/72; H03H 9/74; H03H 9/76
  USPC .................... 333/193–196; 310/313 R–313 D
  See application file for complete search history.

(56) References Cited

U.S. PATENT DOCUMENTS

| | | | | |
|---|---|---|---|---|
| 3,911,381 | A * | 10/1975 | Brooks et al. ................. | 333/195 |
| 3,983,517 | A * | 9/1976 | Weglein ........................ | 333/195 |
| 4,451,805 | A * | 5/1984 | Ono et al. ..................... | 333/195 |
| 4,590,442 | A | 5/1986 | Saito et al. | |
| 5,668,431 | A * | 9/1997 | Saw et al. .................. | 310/313 R |
| 6,683,515 | B1 | 1/2004 | Nakamura et al. | |
| 6,828,878 | B2 * | 12/2004 | Takamine et al. ............. | 333/193 |
| 7,522,894 | B2 * | 4/2009 | Kato et al. .................... | 455/131 |
| 7,973,620 | B2 * | 7/2011 | Shirakawa et al. ........... | 333/189 |
| 8,373,519 | B2 * | 2/2013 | Sinha et al. ................... | 333/101 |
| 2011/0273243 | A1 | 11/2011 | Domingue et al. | |

FOREIGN PATENT DOCUMENTS

| | | |
|---|---|---|
| EP | 2385625 A1 | 11/2011 |
| GB | 1386243 | 3/1975 |
| JP | 60-160719 A | 8/1985 |

OTHER PUBLICATIONS

C. Billard, et al., "200mm Manufacturing Solution for Coupled Resonator Filters", ESSDERC, 2009, 4 pages.

(Continued)

*Primary Examiner* — Dean O Takaoka
*Assistant Examiner* — Alan Wong
(74) *Attorney, Agent, or Firm* — Baker & Hostetler LLP

(57) ABSTRACT

A power device comprises an output port and at least one first acoustic pathway and one second acoustic pathway, each acoustic pathway comprising at least one first input acoustic wave transducer connected to an input port, and an output acoustic wave transducer connected to the output port. Each acoustic pathway further comprises a floating acoustic wave transducer connected to a floating port; the input transducer and the output transducer being separated by a distance equal to $(2m+1)\lambda/4$ with m an integer and $\lambda$ the propagation wavelength; the input transducer and the floating transducer being separated by a distance equal to $(2n+1)\lambda/2$ with n an integer; each output transducer being connected to the output port, said power device being a combiner.

20 Claims, 14 Drawing Sheets

(56) References Cited

OTHER PUBLICATIONS

Alexandre Reinhardt, et al., "Investigation of Spurious Resonances in Thin Film Bulk Acoustic Wave Resonators", 2004 IEEE International Ultrasonics, Ferroelectrics, and Frequency Control Joint 50th Anniversary Conference, pp. 1698-1701, IEEE.

Alexandre Reinhardt, et al., "Simulation of Transverse Effects in FBAR Devices", IEEE MTT-S Digest, 2005, 4 pages.

* cited by examiner

ACOUSTIC WAVE POWER DEVICE

CROSS-REFERENCE TO RELATED APPLICATION

This application claims priority to foreign French patent application No. FR 1159816, filed on Oct. 28, 2011, the disclosure of which is incorporated by reference in its entirety.

FIELD OF THE INVENTION

The field of the invention is that of electromechanical devices utilizing the propagation of acoustic waves instead of electrical signals with a view to producing a power combiner function, notably for RF, while preserving strong isolation between the access ports.

BACKGROUND

Components called "combiners" are used in radiofrequency systems for combining the power of two signals. For example, advanced amplifier architectures require this type of device in order to combine the amplified signals originating from multiple branches. This principle is notably used to produce linear amplifiers on the basis of amplifiers operating in the non-linear regime (LINC) and thereby enjoying better energy efficiency.

Generally, a combiner is a device making it possible for two (or more) signals to be combined into a single signal. According to the architecture of the combiner, it is desirable moreover to add isolation between the input ports, so as to limit the influence of each branch of the circuit on the others. Conventional combiners are embodied on the basis of discrete passive elements or of transmission lines, as illustrated in FIGS. 1a and 1b which show power combiners or dividers embodied in the form of transmission lines with isolation of the input ports and (without particular isolation).

In the context of mobile wireless telecommunications, such as mobile telephony, the dimensions of the circuits must be miniaturized. However, the traditional solutions occupy a sizable space and are difficult to miniaturize. For example, the solution using discrete passive components (inductors, capacitors) requires elements of high values that are difficult to integrate and exhibit high losses. Moreover, solutions using microwave transmission lines require long lines, since these depend on the electrical wavelengths which are typically of the order of a centimeter at frequencies of less than a few GHz. There therefore exists a significant need to find integratable, that is to say miniaturizable, solutions so as to allow the embodiment of numerous architectures requiring combinations of power, in particular RF, for applications of mobile telephony and portable wireless systems type.

In this context, several solutions have already been proposed. These solutions have in common the utilization of acoustic waves to produce combiner or splitter functions. These acoustic waves do indeed exhibit shorter wavelengths than the electrical wavelengths (of the order of a μm at frequencies of less than a few GHz), and therefore allow extreme miniaturization.

A first solution described in Japanese patent JP 60160719 "Surface acoustic wave power splitter", 1985, proposes to produce a power divider (or power splitter) by using surface acoustic wave transducers arranged symmetrically along two distinct paths. The proposed structure is composed of a series of interdigitated-comb transducers, arranged on two acoustic paths as represented in FIG. 2, and linked to an input port and making it possible to convert the electrical signal into surface acoustic waves. These waves thereafter propagate to other transducers linked to the output ports and therefore make it possible to convey the electrical signal thereto. The symmetry makes it possible to ensure that one and the same power is transmitted to the two outputs. On the other hand, with a view to use as a combiner, this arrangement does not specifically ensure isolation between the ports 10 and 11: a signal received for example by the port 10 is transmitted to the port 12 which can in its turn re-emit waves on the lower acoustic path and transmit it to the port 11.

The Applicant has itself filed a patent application FR 10 53444, relating to a second solution using, in this instance, Lamb waves or bulk waves, represented respectively in FIGS. 3a and 3b. In addition to the fact that these solutions utilize various types of acoustic waves to transport the signal from the input ports to one and the same output port, they exhibit the benefit of providing isolation between the input ports. For the embodiment using Lamb waves, this is obtained by arranging along one and the same axis of propagation electrodes connected to the various ports in such a way that they exhibit well defined distances between them. Thus, for waves propagating from the emission electrodes to the reception electrodes, these distances make it possible to form constructive interference, and thus to aggregate their signals, and conversely to form destructive interference at the level of the input ports, thereby guaranteeing isolation between the various inputs. According to this principle, to succeed in interleaving three arrays of electrodes, it is necessary to resort to the embodiment of interconnections allowing the electrical tracks (for example of the output port) to straddle other electrical connections (for example those of the port 2). This principle may turn out to be complex to achieve. For the embodiment using bulk waves, the idea of using two acoustic paths, but this time vertical, is employed again. Along each acoustic path are arranged 3 series of transducers (piezoelectric layers sandwiched between two electrodes), linked, from top to bottom, to the output port, to one of the two input ports, and then to a floating port. Judicious choice of the thicknesses of the various layers of the stack succeeds in obtaining phase shifts between the waves causing constructive interference for those propagating from the input ports to the output ports, and destructive interference for those propagating from an input port to another output port, once again ensuring electrical isolation between the input ports. This embodiment requires a stack of three sets of piezoelectric layers, which, in terms of complexity of embodiment may surpass a longitudinal-coupling filter (CRF, for Coupled Resonator Filter), which is itself already a component that is so complex to produce that it is not at the present time proposed commercially as described in the article by C. Billard, N. Buffet, S. Joblot, A. Reinhardt, G. Parat, P. Bar, 200 *mm manufacturing solution for coupled resonator filters*, ESSDERC 2009.

It is thus apparent that patent FR 10 53444 proposes components ensuring a power combiner function, and moreover isolation of the input ports (or output ports in the case of the splitter) which are highly miniaturizable and integratable, but which may prove to be complex to produce and require the fine tuning of specific production methods.

SUMMARY OF THE INVENTION

In this context the subject of the present invention is a novel type of power device structure that can be a combiner or a divider using the propagation of acoustic waves in order to miniaturize the component and to facilitate its integration into mobile architectures, ensuring isolation of the input ports, but that can be produced with existing industrial methods.

More precisely the subject of the present invention is a power device comprising an output port and at least one first acoustic pathway and one second acoustic pathway, each acoustic pathway comprising at least one first so-called input acoustic wave transducer connected to an input port, and a so-called output acoustic wave transducer connected to the output port characterized in that:
   each acoustic pathway furthermore comprises a so-called floating acoustic wave transducer connected to a so-called floating port;
   the input transducer and the output transducer being separated by a distance equal to $(2m+1)\lambda/4$ with m an integer and $\lambda$ the propagation wavelength;
   the input transducer and the floating transducer being separated by a distance equal to $(2n+1)\lambda/2$ with n an integer;
   each output transducer being connected to the output port, the said power device being a combiner.

The subject of the invention is also a power device comprising an input port, at least one first acoustic pathway and one second acoustic pathway each acoustic pathway comprising at least one first so-called input acoustic wave transducer connected to the input port, and one so-called output acoustic wave transducer connected to an output port characterized in that:
   each acoustic pathway furthermore comprises a so-called floating acoustic wave transducer connected to a so-called floating port;
   the input transducer and the output transducer being separated by a distance equal to $(2m+1)\lambda/4$ with m an integer;
   the output transducer and the floating transducer being separated by a distance equal to $(2n+1)\lambda/2$ with n an integer and $\lambda$ the propagation wavelength;
   each input transducer being connected to the input port, the said power device being a divider.

The use of so-called floating transducers makes it possible to transfer a part of the power of the waves travelling in one of the acoustic pathways to the other pathway, and thus to ensure phase or phase opposition conditions which make it possible to combine the signals which produce constructive interference between them, and not to combine those which produce destructive interference.

According to a variant of the invention, the transducers are surface wave transducers.

According to a variant of the invention, the transducers are plate wave transducers.

According to a variant of the invention, the transducers are interface wave transducers.

Preferably, the input transducers, output transducers and floating transducers are produced on the basis of one and the same piezoelectric material layer. The term layer is intended to mean either a film of material or equally a substrate of this material.

According to a particular mode of the invention, the acoustic wave transducers comprising interdigitated electrode combs, the said input transducer comprises a part of its electrodes connected to a first electrical earth, the said output transducer also comprising a part of its electrodes connected to the said first electrical earth and the said floating transducer comprising a part of its electrodes connected to a so-called floating electrical earth.

According to another embodiment, the combs of the transducers are mounted differentially and are not linked to an electrical earth.

According to a variant of the invention, the said floating earth is the said first earth.

According to a variant of the invention, each acoustic pathway comprises a series of groups $G_{ij}$ of transducers, each group comprising an input transducer, an output transducer and a floating transducer, the said series of groups making it possible to increase the efficiency of energy conversion between the inputs and the outputs.

According to a variant of the invention, in one and the same ith acoustic pathway, the input transducer of a group $G_{ij}$ of an ith acoustic pathway is separated from the input transducer of the group $G_{i,(j+1)}$ of the ith acoustic pathway, by a distance such that an acoustic wave propagating from the group $G_{ij}$ to the group $G_{i,(j+1)}$ undergoes a phase shift of $2k\pi$ with k an integer, between the two input transducers.

According to a variant of the invention, in one and the same ith acoustic pathway, the output transducer of a group $G_{ij}$ of an ith acoustic pathway is separated from the output transducer of the group $G_{i,(j+1)}$ by a distance such that an acoustic wave propagating from the group $G_{ij}$ to the group $G_{i,(j+1)}$ undergoes a phase shift of $2k\pi$ with k an integer, between the two output transducers.

According to a variant of the invention, each acoustic pathway comprises acoustic reflectors at each of its ends.

According to a variant of the invention, the reflectors are short-circuited interdigitated comb arrays.

BRIEF DESCRIPTION OF THE DRAWINGS

The invention will be better understood and other advantages will become apparent on reading the nonlimiting description which follows and by virtue of the appended figures among which.

DETAILED DESCRIPTION

Generally, the present invention can be applied equally well to a device of combiner type as to one of power divider type.

The combiner uses n input ports electrically isolated from one another and an output port, the divider conversely uses an input port and m output ports electrically isolated from one another.

In the description detailed hereinafter the case of a power combiner will more precisely be described.

The object of the present invention is therefore to propose a combiner structure using the propagation of acoustic waves in order to miniaturize the component and to facilitate its integration into mobile architectures, ensuring isolation of the input ports, but that can be produced with existing industrial methods.

Figure 1A:
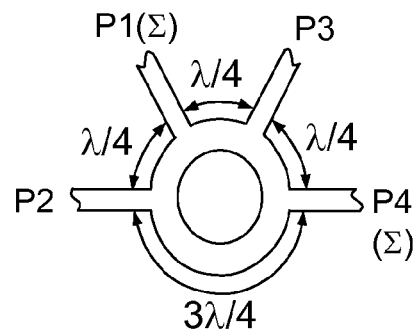
FIGS. 1a and 1b illustrate respectively power combiners or dividers embodied in the form of transmission lines with isolation of the input ports and without particular isolation according to the known art.
Figure 1B:
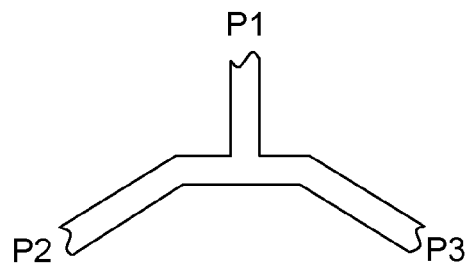
Figure 2:
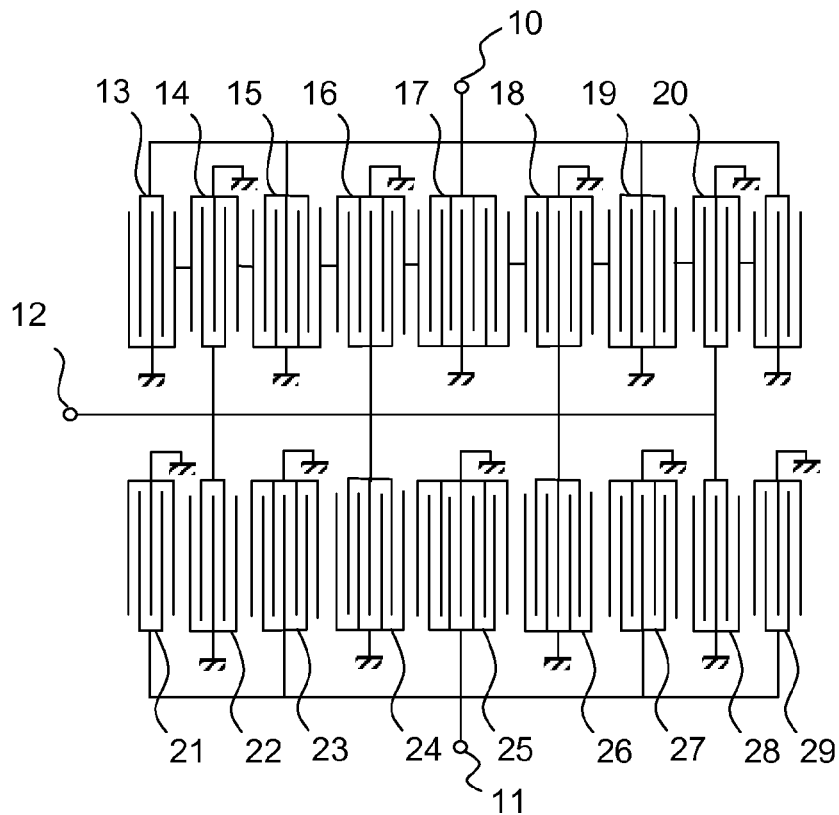
FIG. 2 illustrates a power divider according to the solution proposed in Japanese patent JP 60160719.
Figure 3A:
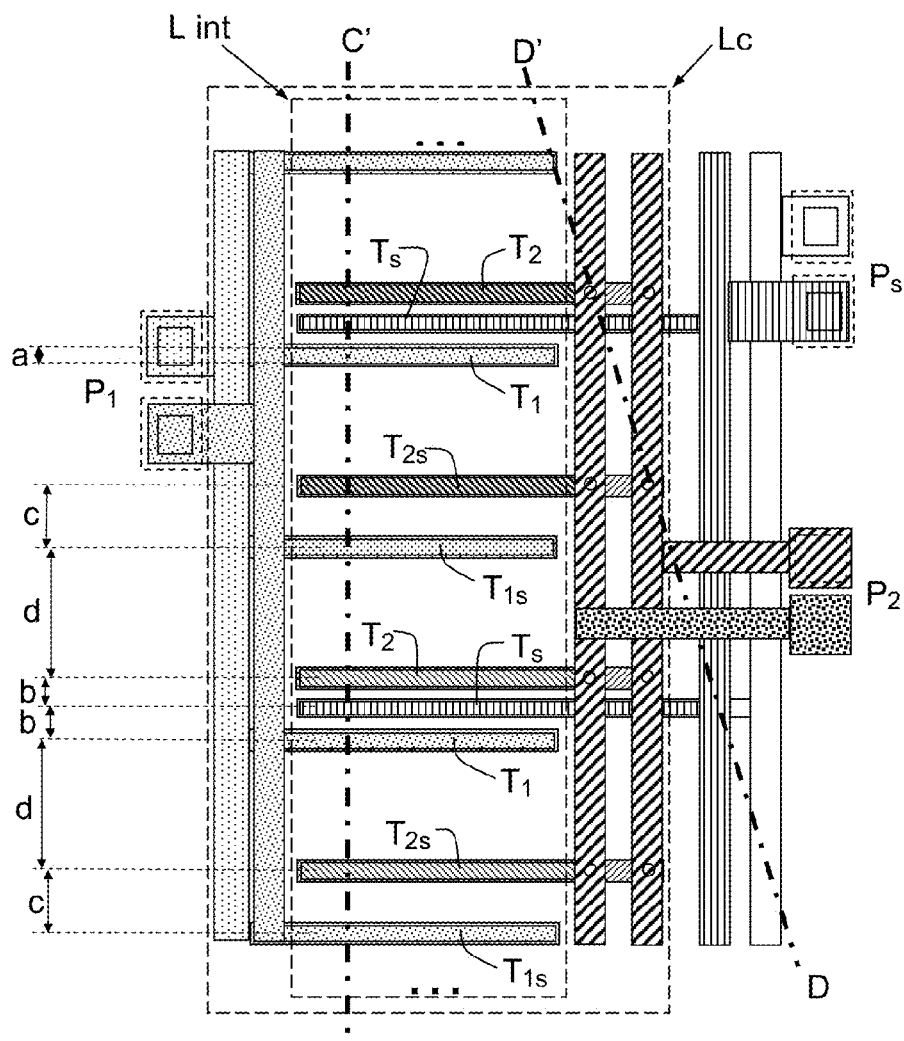
FIGS. 3a and 3b illustrate solutions using respectively Lamb waves with interleaved transducers and bulk wave transducers.
Figure 3B:
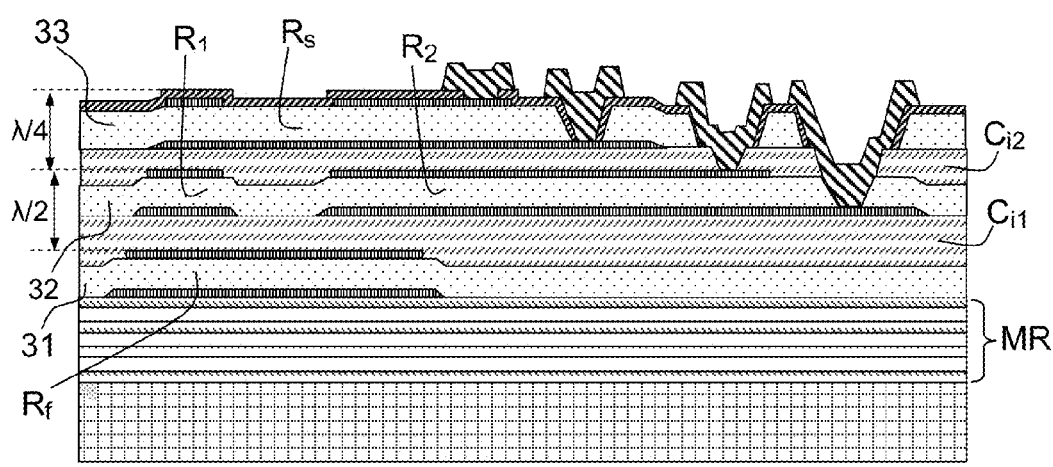
Figure 4:
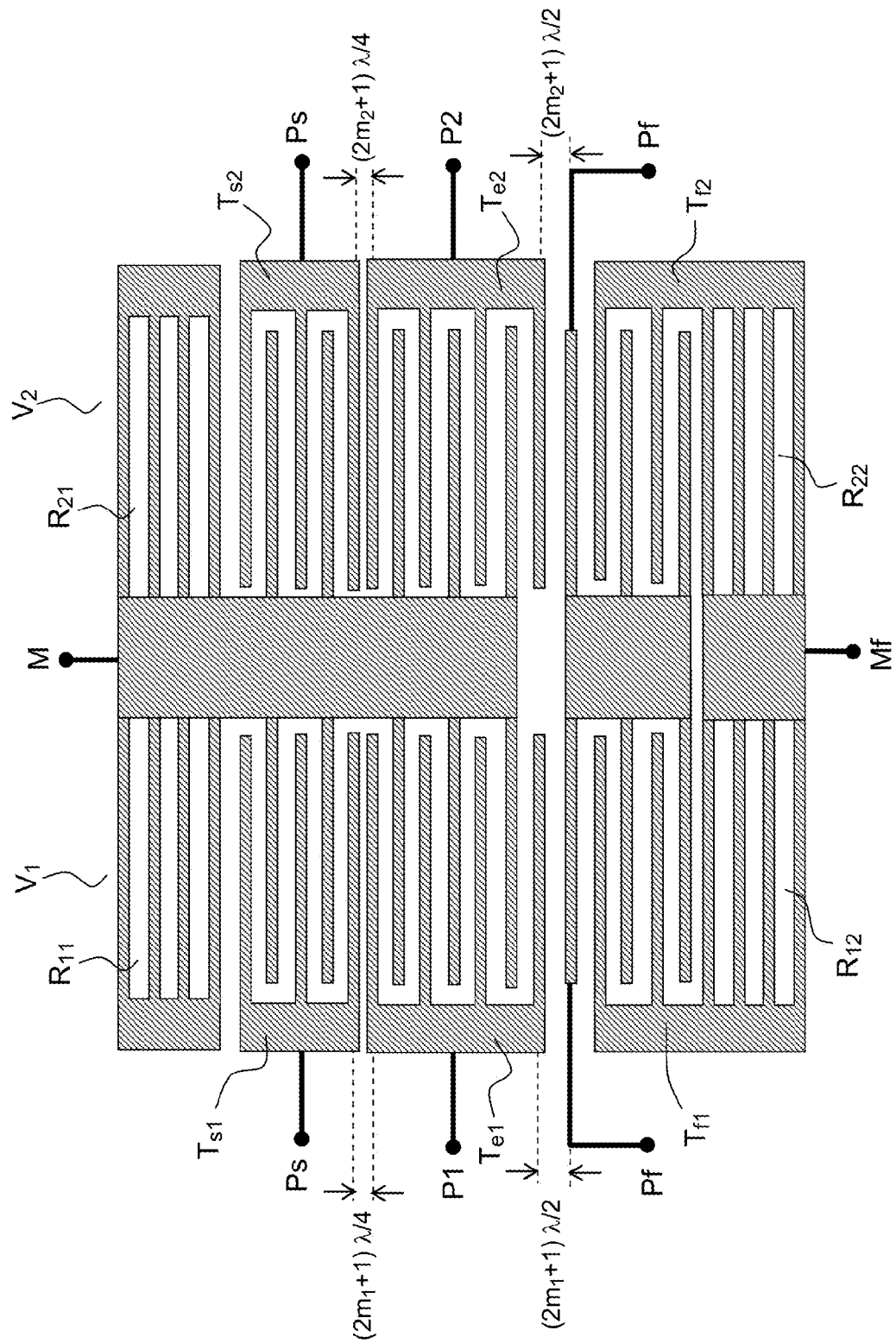
FIG. 4 illustrates an exemplary structure of acoustic-wave type combiner electrodes comprising two acoustic pathways with two input ports.

A combiner structure with two ports allowing the use of surface acoustic waves according to the present invention is represented in FIG. 4.

A first acoustic pathway $V_1$ comprises:
- a surface wave input transducer $Te_1$ comprising a structure of interdigitated electrode combs, one part of whose electrodes is connected to a first input port $P_1$ the other part of the electrodes being connected to the earth M;
- a surface wave output transducer $Ts_1$ comprising a structure of interdigitated electrode combs, one part of whose electrodes is connected to a first input port Ps the other part of the electrodes being connected to the earth M;
- a surface wave so-called floating transducer $Tf_1$ comprising a structure of interdigitated electrode combs, one part of whose electrodes is connected to a so-called floating internal port Pf the other part of the electrodes being connected to an earth $M_f$.

A second acoustic pathway $V_2$ comprises:
- a surface wave input transducer $Te_2$ comprising a structure of interdigitated electrode combs, one part of whose electrodes is connected to a second input port $P_2$ the other part of the electrodes being connected to the earth M;
- a surface wave output transducer $Ts_2$ comprising a structure of interdigitated electrode combs, one part of whose electrodes is connected to a first input port Ps the other part of the electrodes being connected to the earth M;
- a surface wave so-called floating transducer $Tf_2$ comprising a structure of interdigitated electrode combs, one part of whose electrodes is connected to a so-called floating internal port Pf the other part of the electrodes being connected to an earth $M_f$.

At their ends, all the acoustic pathways are delimited by short-circuited interdigitated comb arrays acting as acoustic reflectors. By this procedure, the acoustic coupling between the various inputs and the output is facilitated, since it is done in a distributed manner, along the acoustic path. Moreover, the first acoustic pathway furthermore comprises on either side of the set of transducers reflectors $R_{11}$ and $R_{12}$, the second acoustic pathway also comprising on either side of the set of transducers reflectors $R_{21}$ and $R_{22}$.

Figure 5:
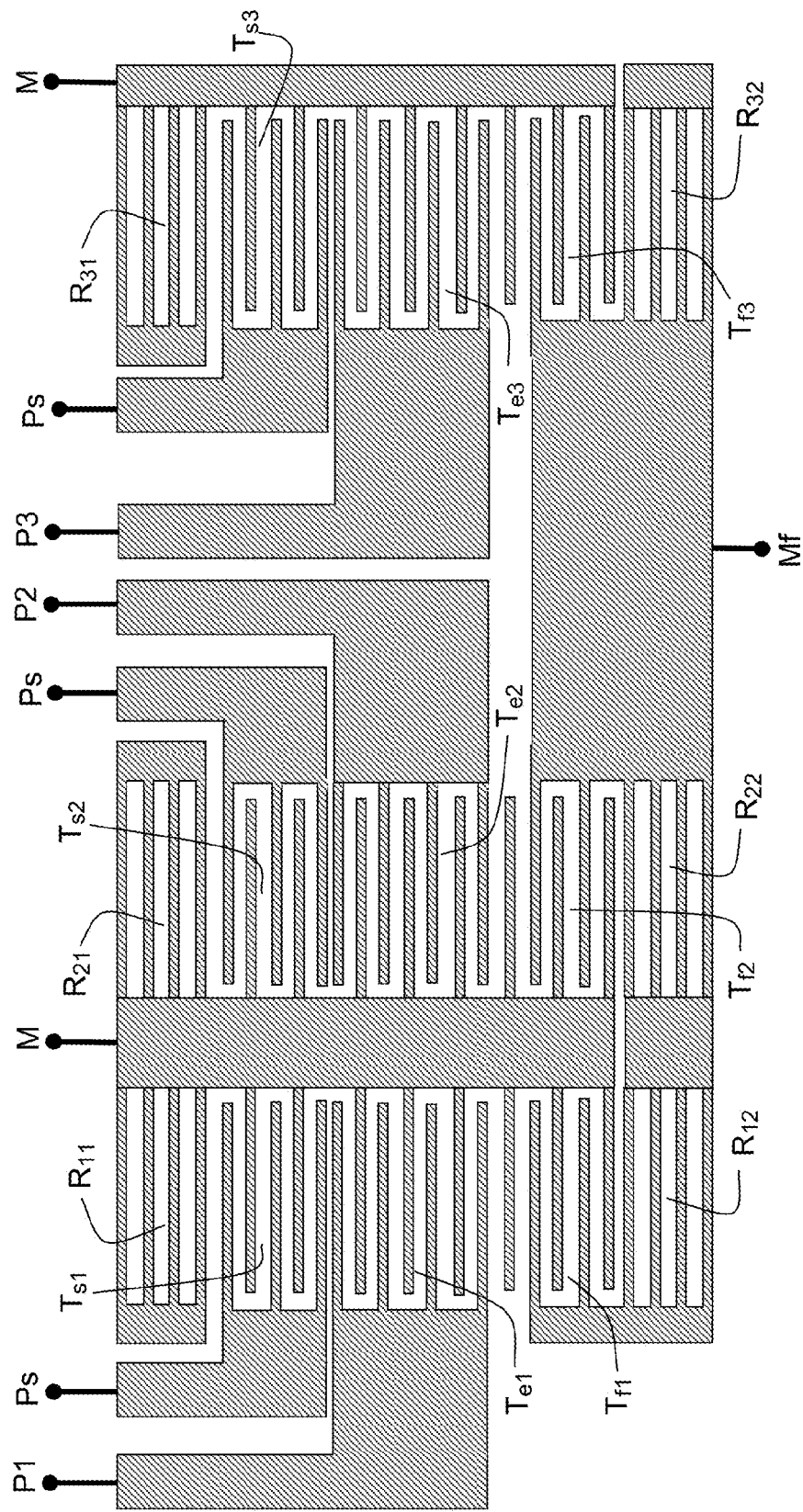
FIG. 5 illustrates an exemplary structure of acoustic-wave type combiner electrodes comprising three acoustic pathways with three input ports.

FIG. 5 illustrates an exemplary combiner configuration with 3 acoustic pathways $V_1$, $V_2$ and $V_3$ according to the invention.

The third pathway is of the same type as the two acoustic pathways illustrated in FIG. 4 and furthermore comprises:
- reflectors $R_{31}$ and $R_{32}$;
- a surface wave input transducer $Te_3$ comprising a structure of interdigitated electrode combs, one part of whose electrodes is connected to a first input port $P_3$ the other part of the electrodes being connected to the earth M;
- a surface wave output transducer $Ts_3$ comprising a structure of interdigitated electrode combs, one part of whose electrodes is connected to a third input port Ps the other part of the electrodes being connected to the earth M;
- a surface wave so-called floating transducer $Tf_3$ comprising a structure of interdigitated electrode combs, one part of whose electrodes is connected to a so-called floating internal port Pf the other part of the electrodes being connected to an earth Mf.

Generally, the input transducer is arranged in such a way that the distance between combs connected to the input port and combs connected to the output port is:
- for the pathway $V_1$, a distance of $(2m_1+1)\lambda/4$, where $m_1$ is an integer number and $\lambda$ the wavelength of the utilized waves;
- for the pathway $V_2$, a distance of $(2m_2+1)\lambda/4$, where $m_2$ is an integer number and $\lambda$ the wavelength of the utilized waves.

This makes it possible to establish an output signal in quadrature with that of the input port and prevents the reflection of the waves to this same input port, ensuring that the signal is not returned to its source. As the electrodes also commonly dubbed "fingers" of the input and output transducers are arranged with a periodicity equal to the wavelength at the relevant frequency, this quadrature condition is true for any wave emitted on an arbitrary finger of the input transducer and reaching another arbitrary finger of the output transducer.

In each of the acoustic pathways, there is also provided another interdigitated comb so-called floating transducer, a part of whose fingers is connected to an internal (floating) port Pf in the device, and another part to an earth Mf, the said earth optionally being distinct from the other earths.

This so-called floating transducer is arranged in such a way that the distance between an electrode linked to this port and an electrode linked to the input port is respectively in each of the pathways:
- for the pathway $V_1$ a distance of $(2n_1+1) \lambda/2$, with $n_1$ an integer number;
- for the pathway $V_2$, a distance of $(2n_2+1) \lambda/2$, with $n_2$ an integer number.

As previously, the fact that all the electrodes are arranged with a periodicity equal to the wavelength at the relevant frequency makes it possible to ensure that the signal recovered on this floating port is in phase opposition with respect to the signal of the input port.

Figure 6:
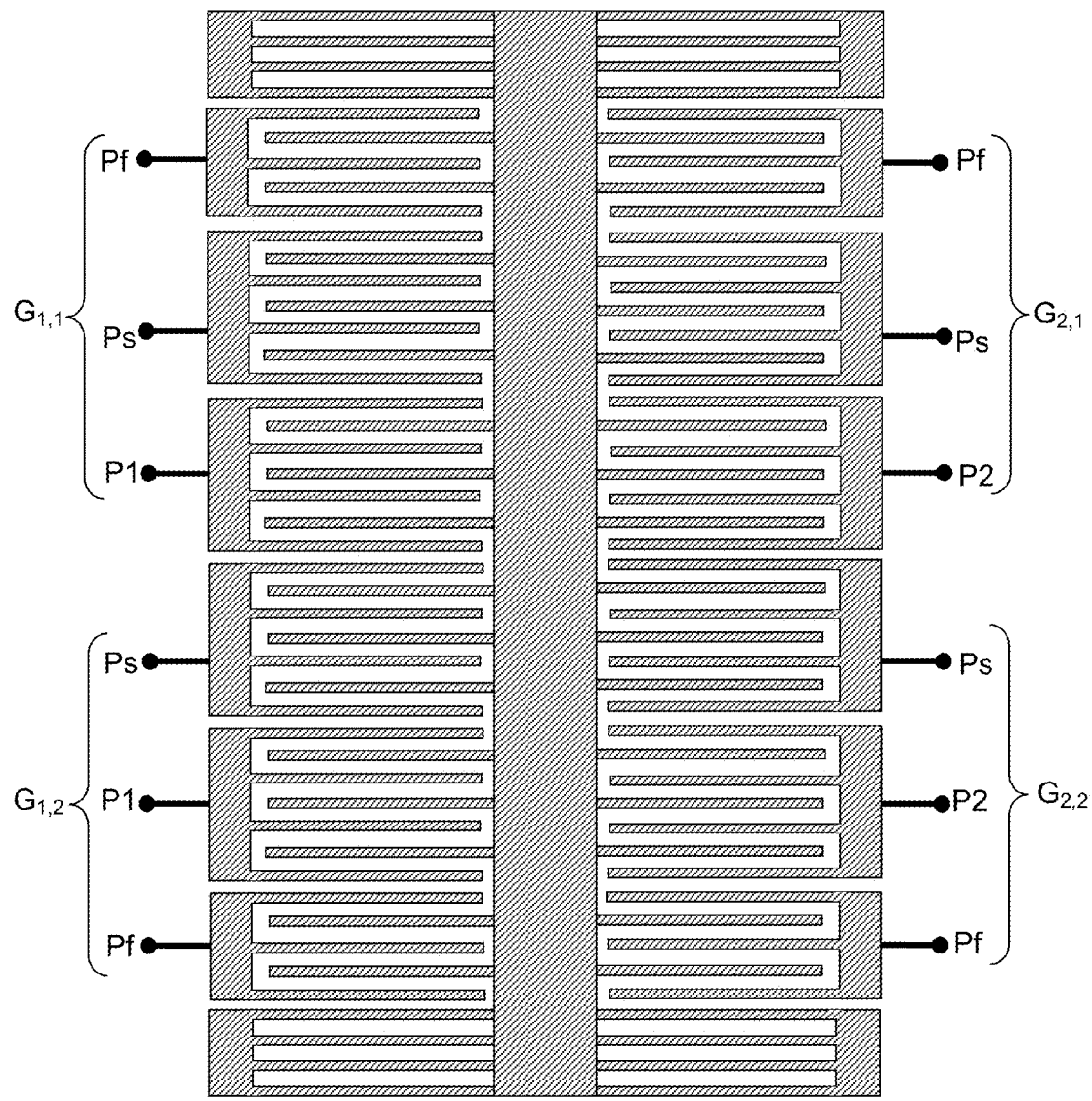
FIG. 6 illustrates an exemplary combiner according to the invention with several groups of transducers.

It is also possible to repeat this structure along the propagation axis so as to increase the efficiency of the energy conversion from the inputs to the output by splitting the various transducers. This is illustrated in FIG. 6.

Each acoustic pathway Vi can comprise a group set $G_{i,j}$ itself comprising an input transducer, an output transducer and a so-called floating transducer. FIG. 6 relates to the case i=2 and j=2. So as not to overload the figure, only the transducer connection ports have been represented.

In group $G_{1,1}$: the floating port $P_f$, the output port Ps, the input port $P_1$.

In group $G_{1,2}$: the output port Ps, the input port $P_1$, the floating port Pf.

In group $G_{2,1}$: the floating port Pf, the output port Ps, the input port $P_2$.

In group $G_{2,2}$: the output port Ps, the input port $P_2$, the floating port Pf.

In all cases, in order for the device to provide the desired electrical properties, it is necessary to ensure that a signal emitted at the level of a port $P_i$ arrives at the output port:

in phase quadrature by the direct path from the port $P_i$ to the output port Ps;

in phase quadrature also by a path passing through the ports: $P_i$-Pf-$P_i$-Ps (reflection at the bottom of the path along the pathway $V_i$);

in phase quadrature also by a path passing through the ports $P_i$-Pf$_i$-Pf$_j$-$P_j$-Ps (path passing through the two acoustic pathways $V_i$ and $V_j$).

Figure 7:
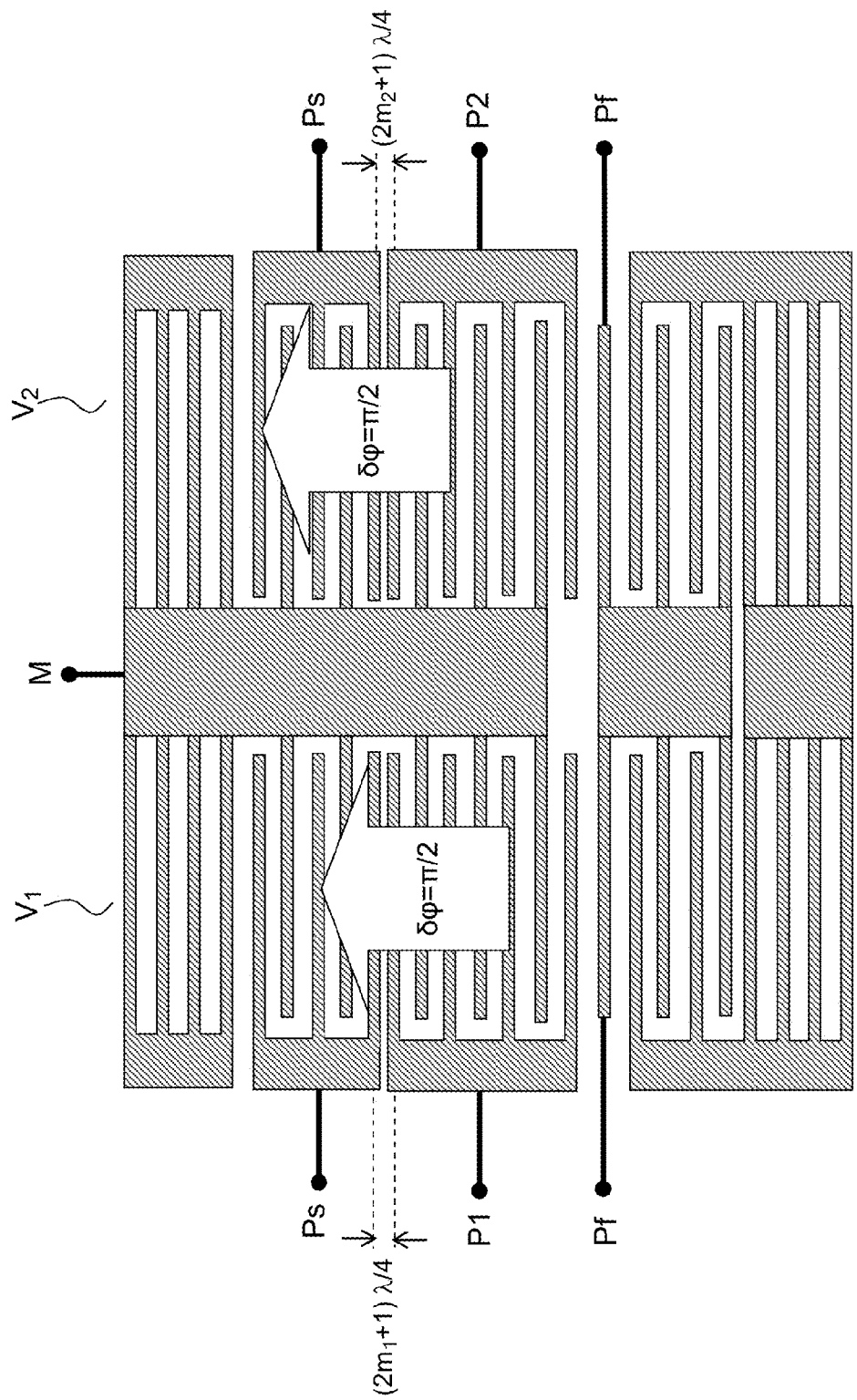
FIG. 7 illustrates the operating principle of the combining of the acoustic waves in a combiner according to the invention.

This is indeed ensured by the spacing of $(2m_1+1)\lambda/4$ (or $(2m_2+1)\lambda/4$) between the input and output transducers and by the fact that all the combs linked to one and the same electrical port are arranged with a distance corresponding to the wavelength $\lambda$ of the utilized wave, as illustrated in FIG. 7.

By symmetry of the structure, a signal emitted at the level of port j also arrives in phase quadrature towards the output port, whatever the acoustic path employed. Therefore, constructive interference is generated between the waves emitted by the input transducers and reaching the level of the output transducer, and the signals applied to the input ports are indeed summed (combined) at the level of the output.

If the input and output transducers have been distributed within the structure, it is also necessary to ensure that the waves emitted by these transducers reach another part of the transducer without undergoing phase shift, so as to ensure constructive interference between the acoustic sources attached to each port. This requires, as illustrated in FIG. 8, that a propagating wave undergo a phase shift which is a multiple of $2\pi c$ during propagation from an electrode of one transducer to an electrode of another transducer.

Figure 8:
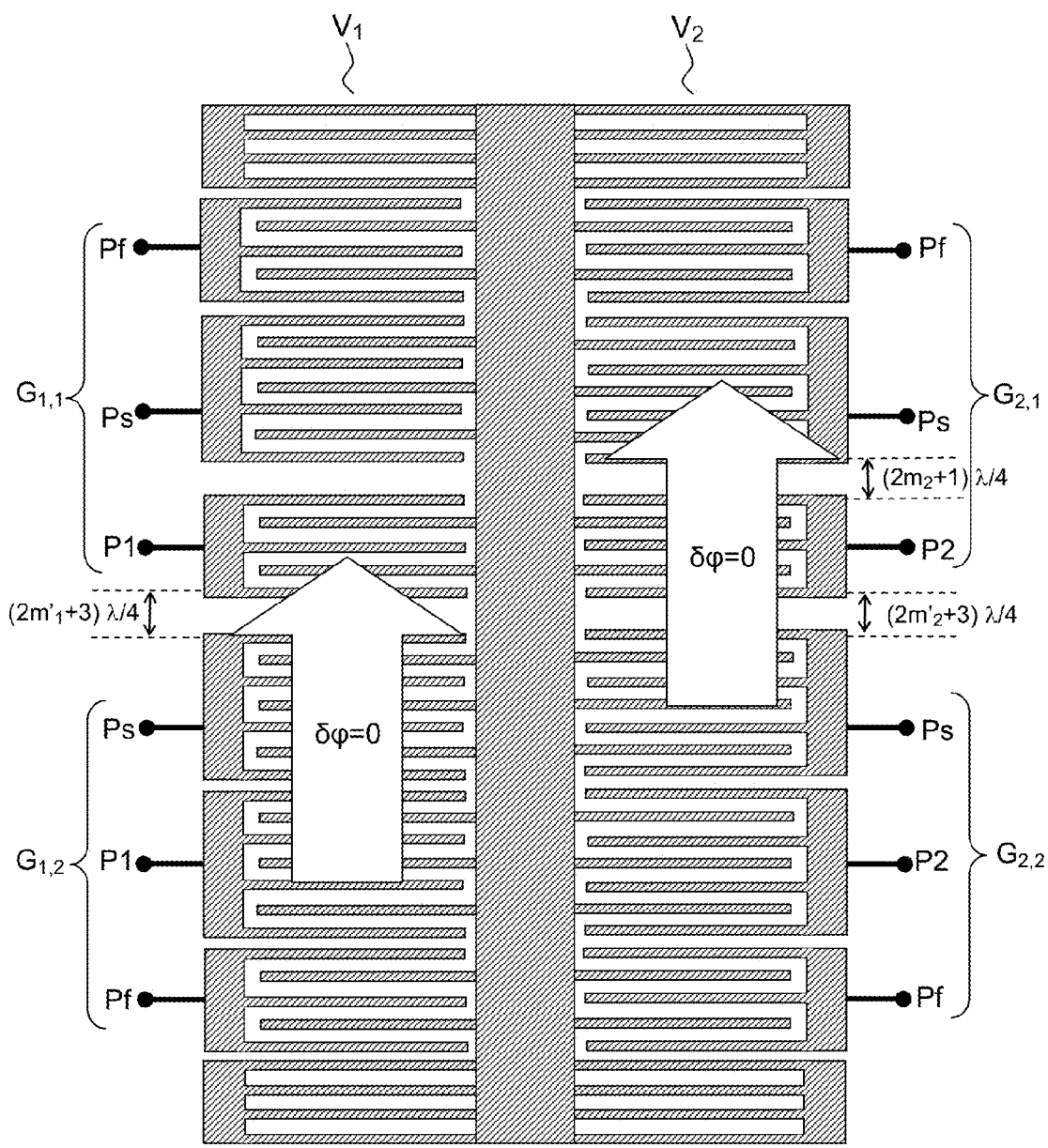
FIG. 8 illustrates the operating principle relating to the maintaining of zero phase shift between transducers linked to one and the same port in a combiner according to the invention.

As represented in FIG. 8, the group $G_{1,1}$ being separated from the group $G_{1,2}$ by a distance equal to $(2m'_1+3)\lambda/4$, this is manifested by the condition $(2m_1+1)\lambda/4+(2m'_1+3)\lambda/4=(m_1+m'_1+2)\lambda/2=N\lambda$ with N an integer number. This requires that $m_1+m'_1$ be equal to an even integer number.

As regards the output port Ps, still according to the same figure, it is necessary to have $(2m'_2+3)\lambda/4+(2m_2+1)\lambda/4=(m'_2+m_2+4)\lambda/2=N\lambda$, or again $m'_2+m_2$ having also to be equal to an even integer number.

It should be noted that according to this exemplary configuration, a distance of $(2m'+3)\lambda/4$ has been chosen between two groups of one and the same pathway, so as to reverse the alternation of the interdigitated combs from one transducer to the other. It would also have been possible to consider in a generic manner a spacing of $(2m'+1)\lambda/4$, and in this case reach the conclusion that m+m' must be equal to an odd integer number.

More generally, these conditions amount to saying that the polarity of the transducers linked to one and the same port must be reversed.

The previously described conditions make it possible to obtain constructive interference for waves emitted at a port, and propagating towards the same port, or towards the output port. These conditions thus ensure that the signals get combined. On the other hand, by themselves, they do not ensure isolation between the input ports. Accordingly, it is necessary that, for waves propagating between two input transducers, a signal emitted by a port $P_1$ should arrive:

in phase opposition by the path port $P_1$-output port Ps (pathway 1)-output port Ps (pathway 2)-port $P_2$.

in phase by the port path $P_1$-port Pf-floating port Pf-port $P_2$.

Destructive interference thus occurs at the level of the port $P_2$ between the waves that followed these two different paths, thereby ensuring isolation between the two electrical inputs.

Figure 9:
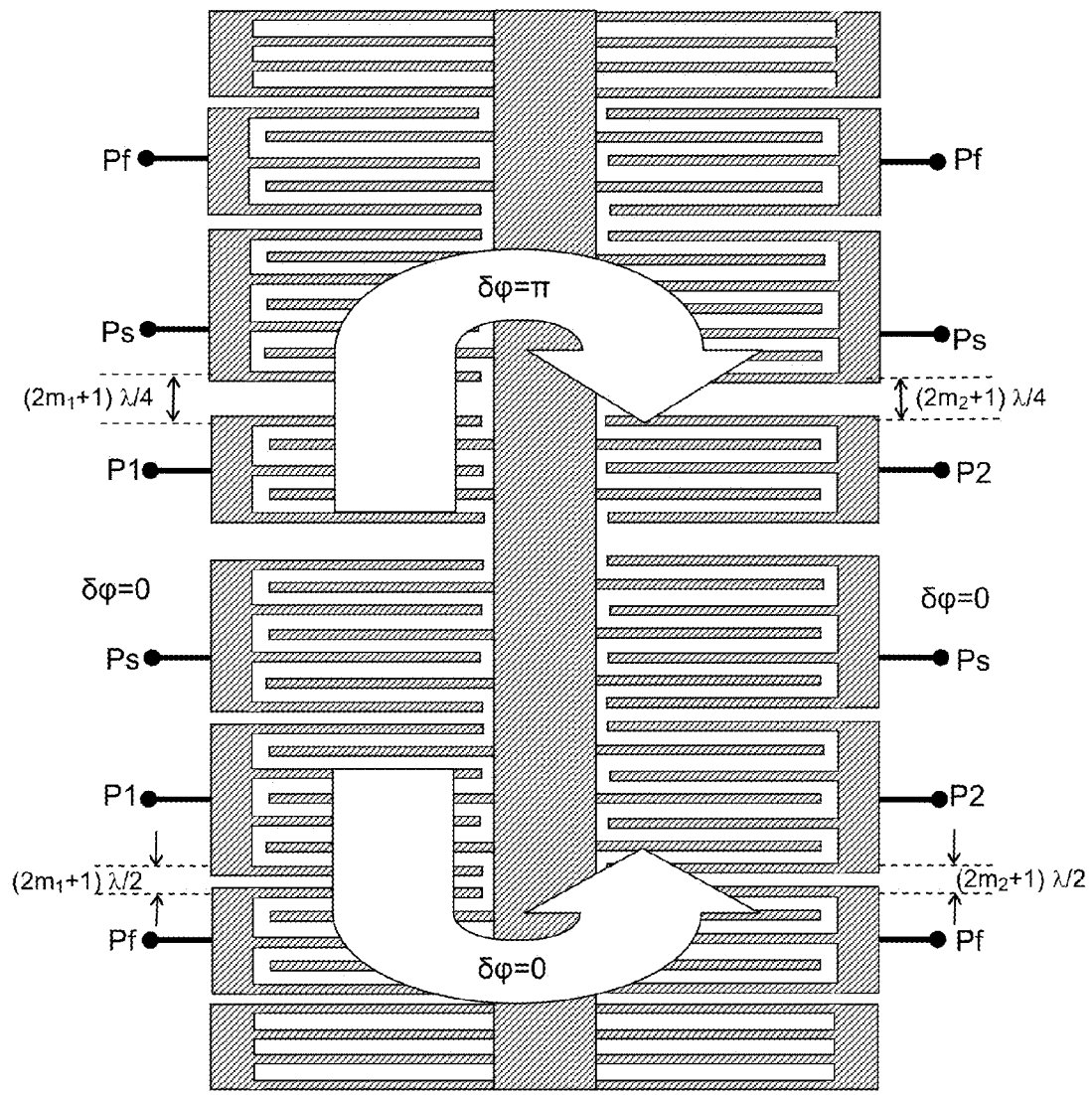
FIG. 9 illustrates the operating principle of the maintaining of a phase opposition between transducers linked to different input ports in a combiner according to the invention.

As illustrated in FIG. 9, phase opposition is obtained provided that the spacings between transducers exhibit the following conditions:

$(2m_1+1)\lambda/4+(2m_2+1)\lambda/4=(m_1+m_2+1)\lambda/2=(2N+1)\lambda/2$, thereby requiring that $m_1+m_2$ must be an even integer number;

$(2n_1+1)\lambda/2+(2n_2+1)\lambda/2=(n_1+n_2+1)\lambda=N'\lambda$, which ultimately does not impose any particular condition on $n_1+n_2$.

It should be noted that the person skilled in the art will know how to best adapt these guiding principles. Notably, the distances between transducers are indicative, and may be modified slightly to compensate for an electrical delay caused by the propagation of the electrical signal along the electrode arrays in the case where the transducers used comprise a large number of fingers and where operations at high frequency are involved (where the electrical wavelengths begin to become comparable with the dimensions of a device, and this may be manifested by delays to the propagation of the currents and voltages along the electrodes, that must then be compensated for).

The present invention, with respect to the solutions previously presented, makes it possible to produce an acoustic combiner with isolation of the input ports while using the existing surface acoustic wave component production methods. Indeed, the principles set forth do not in any way exploit particular properties of a method or of a given stack, either within the framework of surface acoustic wave components, or of interface or plate wave components.

Exemplary Embodiment of a Lamb-Wave Type Combiner According to the Invention:

The Lamb-wave type acoustic combiner uses waves propagating in a simple plate of aluminium nitride (AlN) and confined in this plate by virtue of their reflection at the sold/air interfaces.

Under this plate are arranged Molybdenum (Mo) electrodes 200 nm thick. On top of this plate are disposed Aluminium/Silicon (AlSi) alloy electrodes, also 200 nm thick. For production method reasons, the whole set of transducers is protected by a silicon oxide ($SiO_2$) layer 500 nm thick.

In such a stack, the Lamb waves propagate at a speed of 7800 m/s in the presence of the metallizations, and of 8400 m/s in the absence of any upper electrode. These speeds may be calculated by diverse procedures described in the literature: by finite elements or by numerical procedures such as for example the reflection matrix (or scattering matrix method), as described for example in the articles by A. Reinhardt, V. Laude, M. Solal, S. Ballandras, W. Steichen, *Investigation of spurious resonances in Thin Film Bulk Acoustic Wave Resonators*, Proceedings of the 2004 IEEE Ultrasonics Symposium or by A. Reinhardt, S. Ballandras and V. Laude, *Simulation of transverse effects in FBAR devices*, 2005 IEEE MTT-S Digest.

To produce an acoustic combiner with two input ports $P_1$ and $P_2$, provision is made to produce 4 input transducers $Te_{11}$, $Te_{12}$, $Te_{21}$, $Te_{22}$ on the basis of two transducers which are divided and connected to the two input ports $P_1$ and $P_2$ in two, and to arrange them on either side of transducers $Ts_1$ and $Ts_2$ connected to the output port Ps. Each acoustic path is terminated by a floating transducer $Tf_{11}$, $Tf_{12}$, $Tf_{21}$ and $Tf_{22}$, serving to ensure the electrical link between the two acoustic paths.

Figure 10:
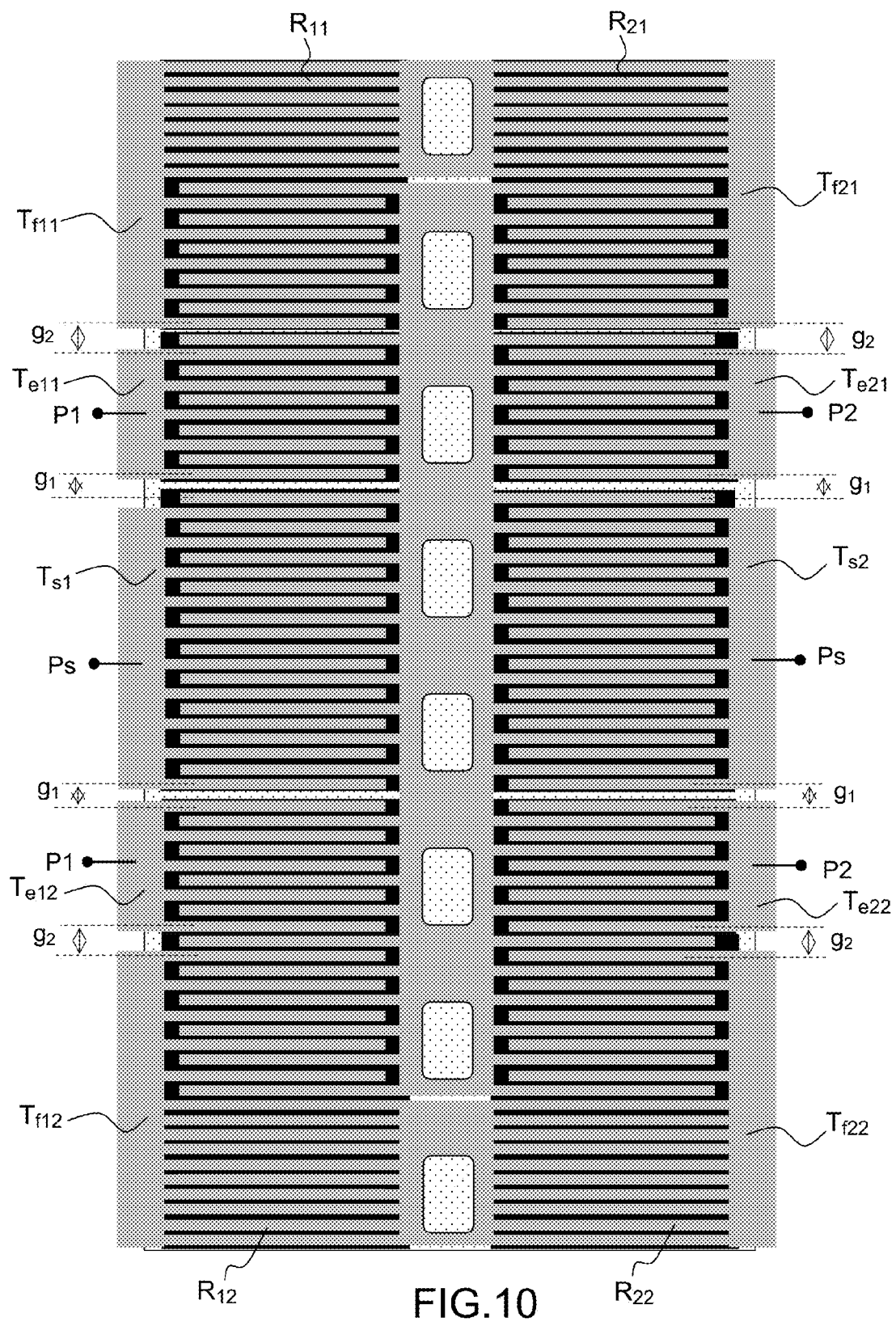
FIG. 10 illustrates an exemplary embodiment of a combiner utilizing Lamb waves in a combiner according to the invention.

Each transducer consists of interdigitated combs produced at the level of the upper electrode, and of a floating metallic plane produced at the level of the lower electrode. Arbitrarily, it is possible to choose a length of 10 fingers for each input transducer and for the floating transducers, as against 20 for the transducers connected to the output ports. Finally, the whole structure is flanked by arrays of reflectors comprising $R_{11}$, $R_{12}$, $R_{21}$, $R_{22}$, some hundred short-circuited fingers. The structure obtained is represented in FIG. 10.

The width a of the electrodes of the interdigitated combs is taken as equal to a quarter of a wavelength under the combs, i.e. approximately 1 µm at a frequency of 2 GHz. The distance between the fingers of one and the same transducer is also taken as equal to 1 µm. The only departures from this rule are the distances between transducers:

from the centre of a finger of the endmost transducer of the port 1 (or 2) to the finger closest to the output port, a distance $g_1$ equal to 3.1 µm is imposed (i.e. approximately $3\lambda/4$)

from the centre of a finger of the endmost transducer of the port 1 (or 2) to the finger closest to the floating port, a distance $g_2$ equal to 6.25 µm is imposed (i.e. approximately $3\lambda/2$)

With a total of 260 electrodes, such a structure possesses proportions of the order of 500×500 µm², i.e. much less than an equivalent structure embodied by conventional microwave transmission lines operating at the same frequency.

Figure 11A:
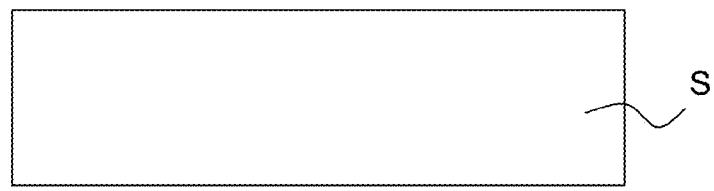
FIGS. 11a to 11c illustrate the various steps of a first exemplary method for producing a combiner according to the invention.
Figure 11B:
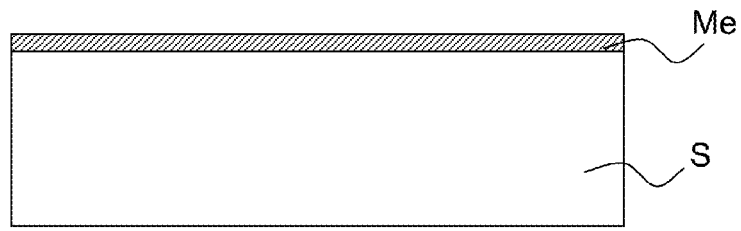
Figure 11C:
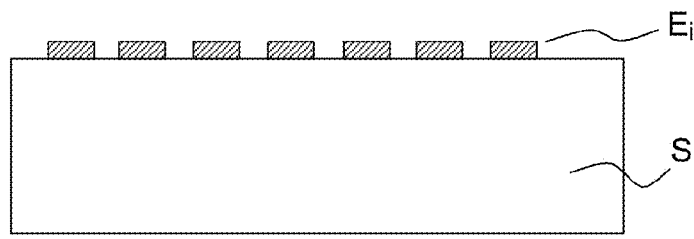

First Exemplary Method for Fabricating the Exemplary Surface Wave Combiner:

The various steps of the method are illustrated by FIGS. 11a to 11c.

Step 1 is illustrated in FIG. 11a: a piezoelectric substrate S is cleaned (said substrate being of any type of piezoelectric material, for example quartz, lithium niobate, lithium tantalate, langasite, langatate, etc.) and possessing any crystalline orientation leading to the use of waves exhibiting the sought-after characteristics making it possible to convey a frequency, a range of operating frequencies and a desired level of losses.

Step 2 is illustrated in FIG. 11b: a metal layer Me (for example Aluminium, but it could also be Molybdenum, Tungsten, Ruthenium, Copper, Gold, etc.) is deposited by cathodic sputtering, on the surface of the substrate S.

Step 3 is illustrated in FIG. 11c: conventional steps of photolithography, dry etching and then removal of the resin are undertaken so as to define the surface electrode Ei architectures.

Second Exemplary Method for Fabricating a Lamb Acoustic-Wave Type Combiner According to the Invention:

The various steps of the method are illustrated by FIGS. 12a to 12i.

Figure 12A:
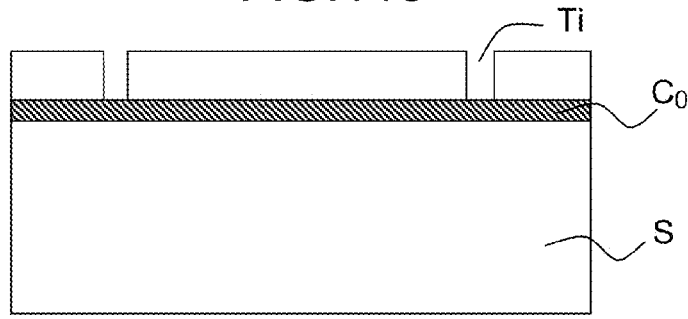
FIGS. 12a to 12i illustrate the various steps of a second exemplary method for producing a combiner according to the invention.

Step 1 illustrated in FIG. 12a relates to the production of trenches Ti in an SOI (for Silicon on Insulator) substrate by dry etching of the silicon, comprising a silicon substrate S and incorporating a dielectric layer $C_0$.

Figure 12B:
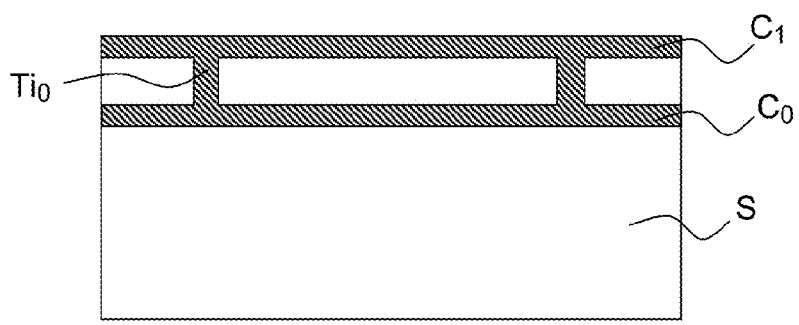

Step 2 illustrated in FIG. 12b relates to a thermal oxidation operation so as to plug the trenches formed beforehand during the growth of the silicon oxide. This operation defines the edges (Tio, $C_1$) of a well which will allow an air cavity to be constructed under the piezoelectric membrane.

Figure 12C:
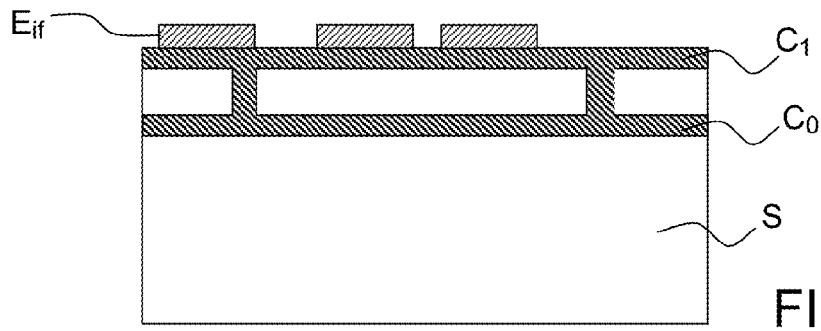

Step 3 illustrated in FIG. 12c relates to the deposition and to the structuring of a layer (by photolithography, fluorinated dry etching and resin removal) making it possible to define molybdenum lower electrodes $Ei_f$.

Figure 12D:
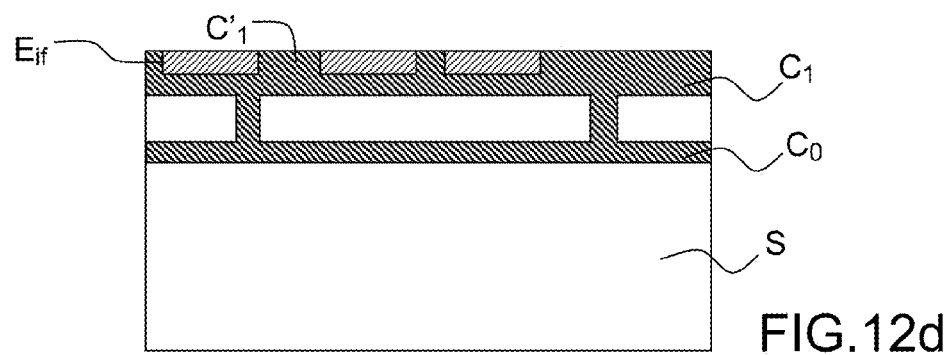

Step 4 illustrated in FIG. 12d relates to the deposition of a silicon oxide layer $C_1'$ (for example by "PECVD"), followed by chemical-mechanical planarization of "CMP" type making flush at the level of the top of the metallic electrodes, so as to provide a perfectly plane surface.

Figure 12E:
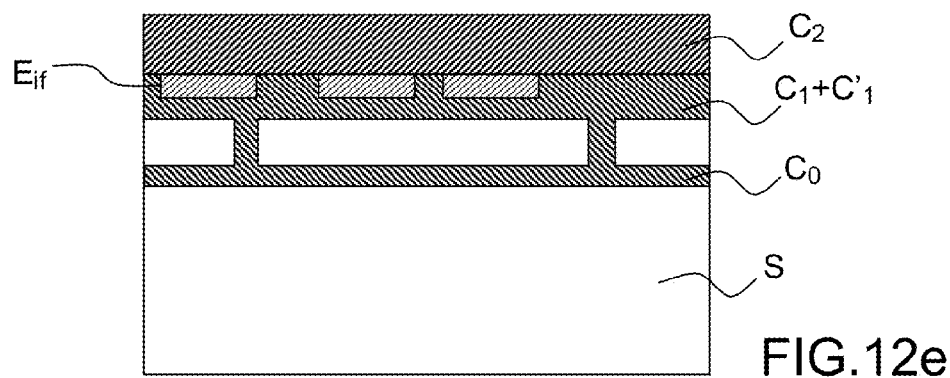

Step 5 illustrated in FIG. 12e relates to the deposition of an aluminium nitride layer $C_2$ (by pulsed DC reactive cathodic sputtering).

Figure 12F:
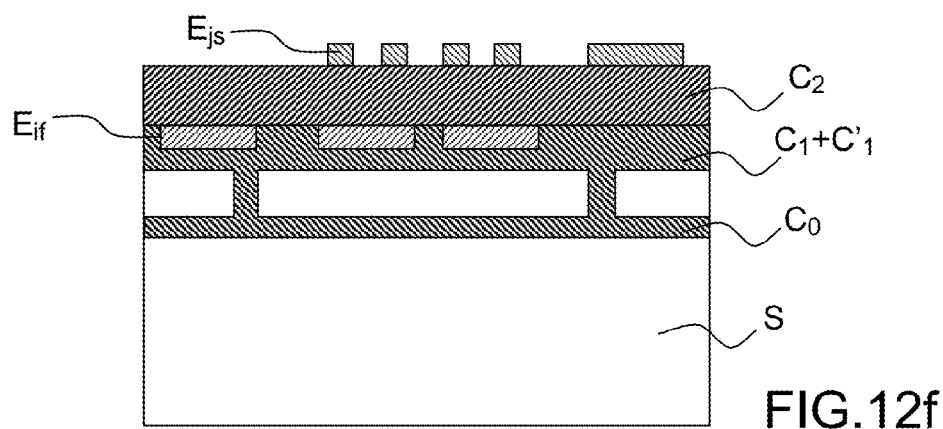

Step 6 illustrated in FIG. 12f relates to the deposition of a layer of AlSi by sputtering and then to the definition of the upper electrodes $Ej_s$ by lithography, chlorinated dry etching, followed by resin removal.

Figure 12G:
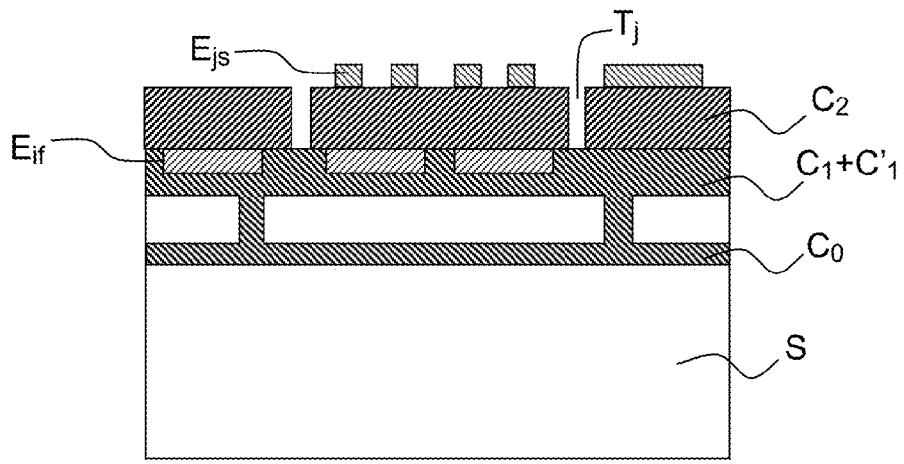

Step 7 illustrated in FIG. 12g relates to steps of lithography, attack of this AlN layer by chlorinated dry etching so as to define release openings Tj.

Figure 12H:
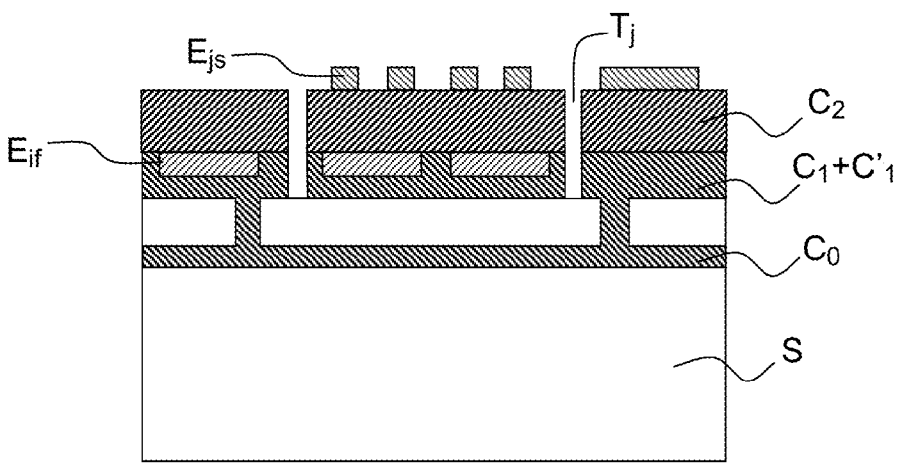

Step 8 illustrated in FIG. 12h relates to an operation of fluorinated dry etching of the silicon oxide situated under the AlN, followed by resin removal through the layers $C_1$ and $C_1'$.

Figure 12I:
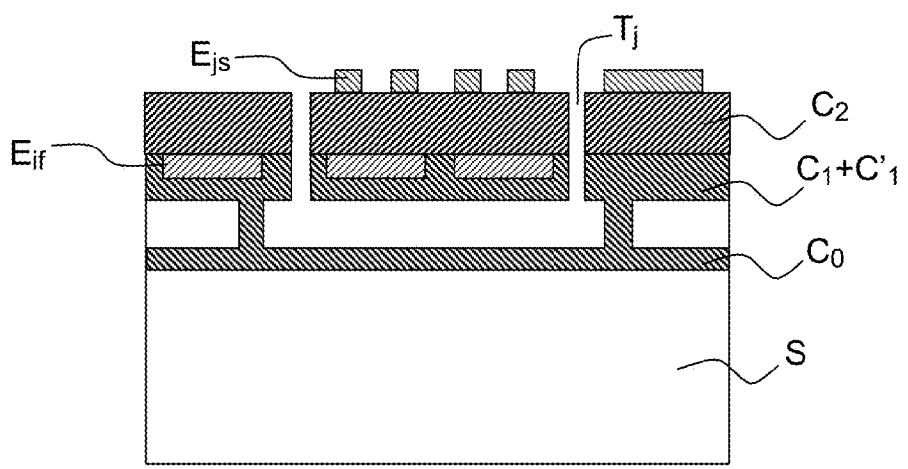

Step 9 illustrated in FIG. 12i relates to an operation of etching the silicon in the prior wells defined by step 2, by gaseous XeF2.

Third Exemplary Method for Fabricating A Combiner Using Guided Waves in a Piezoelectric Layer Deposited on an Acoustic Bragg Mirror According to the Invention:

The various steps of the method are illustrated by FIGS. 13a to 13f.

Figure 13A:
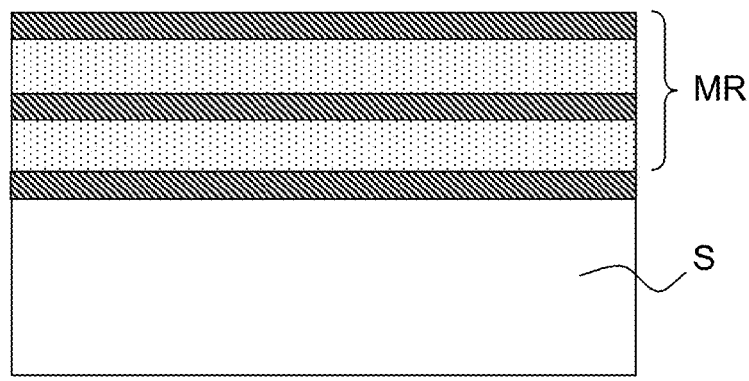
FIGS. 13a to 13f illustrate the various steps of a third exemplary method for producing a combiner according to the invention.

Step 1 illustrated in FIG. 13a relates to the deposition alternately of layers of SiOC, SiN, SiOC, SiN, SiOC by PECVD so as to form an acoustic Bragg mirror MR, on the surface of a substrate S.

Figure 13B:
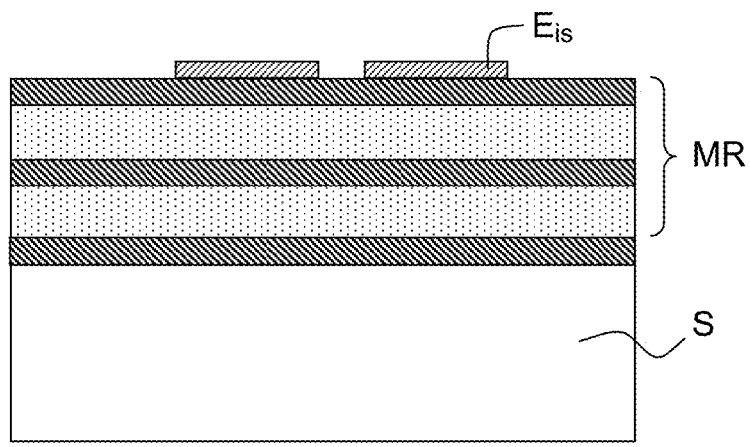

Step 2 illustrated in FIG. 13b relates to the deposition of a molybdenum layer by cathodic sputtering. Operations of photolithography, fluorinated dry etching, followed by resin removal are then undertaken so as to define the lower electrodes $Ei_f$.

Figure 13C:
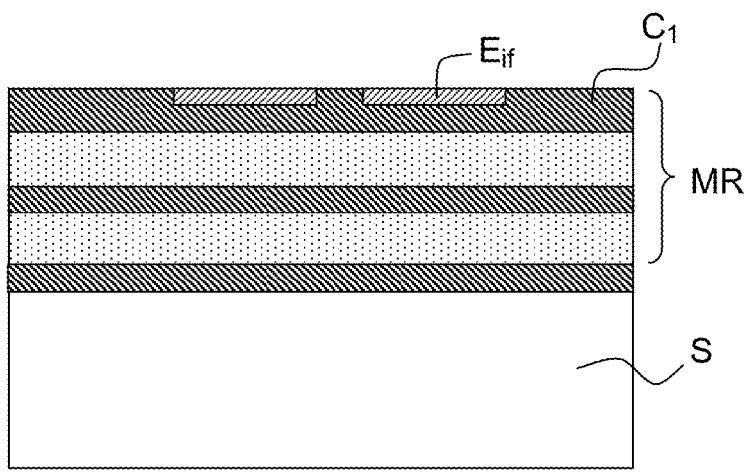

Step 3 illustrated in FIG. 13c relates to the deposition of a silicon oxide layer $C_1$ by "PECVD", followed by chemical-mechanical polishing "CMP" to planarize the surface of the plate by making flush at the level of the lower electrodes.

Figure 13D:
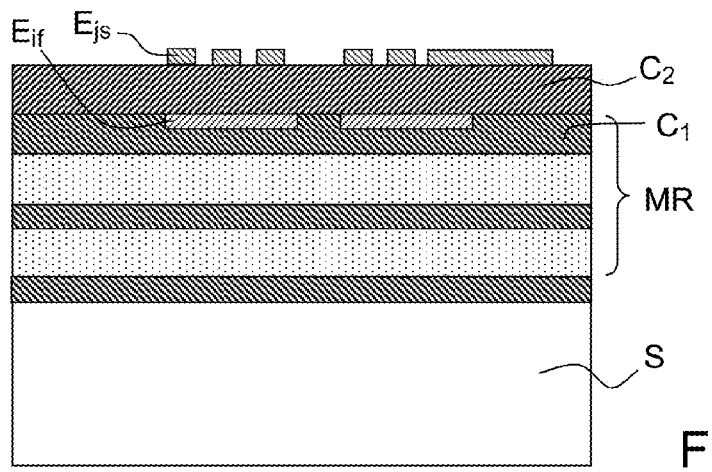

Step 4 illustrated in FIG. 13d relates to the deposition of a layer $C_2$ of aluminium nitride by pulsed DC reactive cathodic sputtering, followed by a layer of molybdenum by cathodic sputtering. Steps of photolithography, fluorinated dry etching, followed by resin removal make it possible to define the upper electrodes $Ej_s$.

Figure 13E:
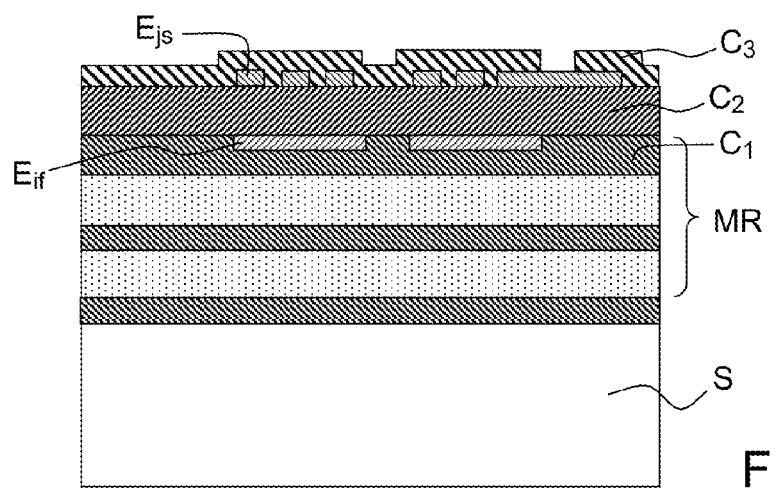

Step 5 illustrated in FIG. 13e relates to the deposition of a passivation layer $C_3$ of silicon nitride by PECVD, followed by operations of photolithography, dry etching and resin removal so as to define openings $T_k$ in the passivation layer allowing electrical contact towards the upper electrode.

Figure 13F:
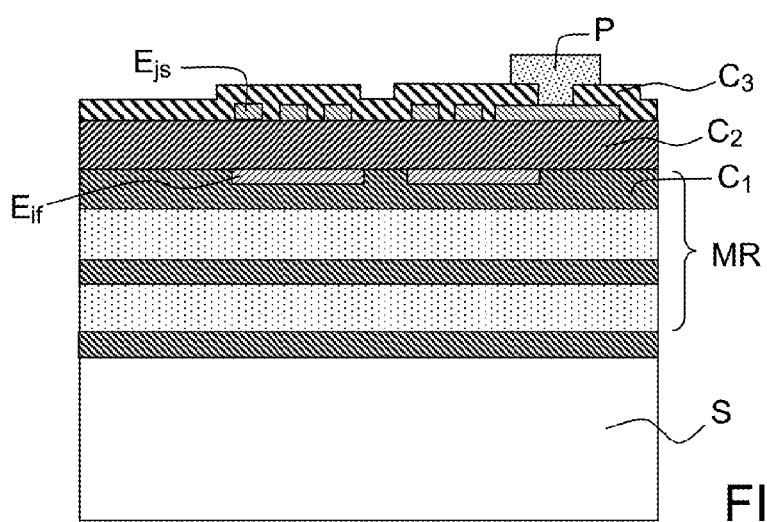

Step 6 illustrated in FIG. 13f relates to the deposition of an aluminium layer (of about 1 µm) by sputtering. Steps of photolithography, chlorinated dry etching, followed by resin removal then allow the formation of contacts pads P.

The invention claimed is:

1. A power device comprising:
    an output port and at least one first acoustic pathway and one second acoustic pathway, each acoustic pathway comprising at least one first input acoustic wave transducer connected to an input port, and an output acoustic wave transducer connected to the output port,
    each acoustic pathway comprising a floating acoustic wave transducer connected to a floating port;
    the input transducer and the output transducer being separated by a distance equal to $(2m+1)\lambda/4$ with m an integer and $\lambda$ the propagation wavelength;

the input transducer and the floating transducer being separated by a distance equal to $(2n+1)\lambda/2$ with n an integer;

each output transducer being connected to the output port, said power device being a combiner.

2. The power device according to claim 1, in which the transducers are surface wave transducers.

3. The power device according to claim 1, in which the transducers are plate wave transducers.

4. The power device according to claim 1, in which the transducers are interface wave transducers.

5. The power device according to claim 1, in which the input transducers, output transducers and floating transducers are produced on the basis of one and the same piezoelectric material layer.

6. The power device according to claim 1, in which each acoustic pathway comprises a series of groups $G_{ij}$ of transducers, each group comprising an input transducer, an output transducer and a floating transducer, said series of groups making it possible to increase the efficiency of energy conversion between the inputs and the outputs.

7. The power device according to claim 6, in which in one and the same ith acoustic pathway, the input transducer of a group $G_{ij}$ of an ith acoustic pathway is separated from the input transducer of the group $G_{i,(j+1)}$ by a distance such that an acoustic wave propagating from the group $G_{ij}$ to the group $G_{i,(j+1)}$ undergoes a phase shift of $2k\pi$ with k an integer, between the two input transducers.

8. The power device according to claim 6, in which in one and the same ith acoustic pathway, the output transducer of a group $G_{ij}$ of an ith acoustic pathway is separated from the output transducer of the group $G_{i,(j+1)}$ by a distance such that an acoustic wave propagating from the group $G_{ij}$ to the group $G_{i(j+1)}$ undergoes a phase shift of $2k\pi$ with k an integer between the two output transducers.

9. The power device according to claim 1, in which each acoustic pathway comprises acoustic reflectors at each of its ends.

10. The power device according to claim 9, in which the reflectors are short-circuited interdigitated comb arrays.

11. A power device comprising:

an input port, at least one first acoustic pathway and one second acoustic pathway each acoustic pathway comprising at least one first input acoustic wave transducer connected to the input port, and an output acoustic wave transducer connected to an output port, each acoustic pathway comprising a floating acoustic wave transducer connected to a floating port;

the input transducer and the output transducer being separated by a distance equal to $(2m+1)\lambda/4$ with m an integer;

the output transducer and the floating transducer being separated by a distance equal to $(2n+1)\lambda/2$ with n an integer and $\lambda$ the propagation wavelength;

each input transducer being connected to the input port, said power device being a divider.

12. The power device according to claim 11, in which the transducers are surface wave transducers.

13. The power device according to claim 11, in which the transducers are plate wave transducers.

14. The power device according to claim 11, in which the transducers are interface wave transducers.

15. The power device according to claim 11, in which the input transducers, output transducers and floating transducers are produced on the basis of one and the same piezoelectric material layer.

16. The power device according to claim 11, in which each acoustic pathway comprises a series of groups $G_{ij}$ of transducers, each group comprising an input transducer, an output transducer and a floating transducer, said series of groups making it possible to increase the efficiency of energy conversion between the inputs and the outputs.

17. The power device according to claim 16, in which in one and the same ith acoustic pathway, the input transducer of a group $G_{ij}$ of an ith acoustic pathway is separated from the input transducer of the group $G_{i,(j+1)}$ by a distance such that an acoustic wave propagating from the group $G_{ij}$ to the group $G_{i,(j+1)}$ undergoes a phase shift of $2k\pi$ with k an integer, between the two input transducers.

18. The power device according to claim 16, in which in one and the same ith acoustic pathway, the output transducer of a group $G_{ij}$ of an ith acoustic pathway is separated from the output transducer of the group $G_{i,(j+1)}$ by a distance such that an acoustic wave propagating from the group $G_{ij}$ to the group $G_{i,(j+1)}$ undergoes a phase shift of $2k\pi$ with k an integer between the two output transducers.

19. The power device according to claim 11, in which each acoustic pathway comprises acoustic reflectors at each of its ends.

20. The power device according to claim 19, in which the reflectors are short-circuited interdigitated comb arrays.

* * * * *